(12) United States Patent
Chen

(10) Patent No.: US 10,879,678 B2
(45) Date of Patent: Dec. 29, 2020

(54) CONFIGURING A POWER DISTRIBUTOR USING A DETACHABLE DISPLAY

(71) Applicant: Liang Light Chen, Los Gatos, CA (US)

(72) Inventor: Liang Light Chen, Los Gatos, CA (US)

(*) Notice: Subject to any disclaimer, the term of this patent is extended or adjusted under 35 U.S.C. 154(b) by 0 days.

(21) Appl. No.: 16/558,240

(22) Filed: Sep. 2, 2019

(65) Prior Publication Data

US 2019/0393684 A1 Dec. 26, 2019

Related U.S. Application Data

(63) Continuation-in-part of application No. 16/013,100, filed on Jun. 20, 2018, now Pat. No. 10,476,218.

(51) Int. Cl.
*H02B 1/20* (2006.01)
*H01R 25/00* (2006.01)
*H05K 5/00* (2006.01)

(52) U.S. Cl.
CPC .............. *H02B 1/20* (2013.01); *H01R 25/006* (2013.01); *H05K 5/0017* (2013.01)

(58) Field of Classification Search
CPC ...... G06F 1/1601; G06F 3/1446; G06F 1/188; G06F 1/189; G06F 3/147; G06F 1/26; G06F 1/1654; G06F 1/1637; G09F 9/3023; G09G 2330/02; G09G 2360/04; G09G 5/003; H05K 5/0017; H05K 7/1427
USPC ...................... 361/679.29, 752; 345/1.3, 1.1
See application file for complete search history.

(56) References Cited

U.S. PATENT DOCUMENTS

| | | | | |
|---|---|---|---|---|
| 7,268,998 | B2 * | 9/2007 | Ewing | H05K 7/1492 174/59 |
| 2002/0135974 | A1 * | 9/2002 | Bell | G06F 1/1632 361/679.41 |
| 2002/0183862 | A1 * | 12/2002 | Chen | G06F 1/169 700/1 |
| 2009/0051220 | A1 * | 2/2009 | Cleveland | H02G 3/00 307/13 |
| 2011/0205693 | A1 * | 8/2011 | Jansma | H01R 13/514 361/601 |
| 2012/0188279 | A1 * | 7/2012 | Demaine | G06T 19/006 345/633 |
| 2014/0363988 | A1 * | 12/2014 | An | G06F 1/1626 439/39 |
| 2016/0174400 | A1 * | 6/2016 | Nakano | H05K 5/0017 361/807 |

* cited by examiner

*Primary Examiner* — Mandeep S Buttar
(74) *Attorney, Agent, or Firm* — Douglas L. Weller

(57) ABSTRACT

A power distributor includes a detachable display and a power distribution unit. The power distribution unit includes a plurality of electrical sockets and a display port available to provide connection to the detachable display. Configuration parameters are stored within the power distribution unit. The detachable display includes a memory that contains configuration information for the power distribution unit. The configuration information can be transmitted through the display port to the power distribution unit and stored by the power distribution unit as the configuration parameters.

19 Claims, 11 Drawing Sheets

CONFIGURING A POWER DISTRIBUTOR USING A DETACHABLE DISPLAY

BACKGROUND

Independent power supply equipment of multiple outlets or device power distributors are widely used in the real world. A power distributor is a block of electrical sockets that is also variously referred to as a power strip, an extension block, a power board, a power bar, a plug board, a trailer lead and by other names.

DESCRIPTION OF THE EMBODIMENT

The implementations disclosed herein describe a detachable display for a power distributor. The power distributor has multiple display ports that will receive the detachable display. This allows the detachable display to be attached to the power distribution at a location and orientation that will be most accessible to a user of the power distributor. The display ports can be hard wired or can provide a wireless interface.

The detachable display is used, for example, to show power and communication information processed in a microcontroller of the power distributor. For example, the detachable display can be detached from one power distributor and attached to another power distributor. For applications that require many power distributors, a single detachable display can be used to install and configure all the power distributors. This can result in significant savings over a system where each power distributor has a dedicated display.

The mounting location of the detachable display on a power distributor can be based on the installation location of the power distributor. The orientation of the detachable display can also be varied to accommodate an angle from which the detachable display will be read.

For example, the detachable display can be magnetically attached to a power distributor with or without use of a locating pin. Alternatively, or in addition, a secure plug connector can be used to secure the portable display to the power distributor while providing hardwire signal and power connections. A screw or other physical attachment device (such as a clasp) can also be used to securely hold the portable display at a desired on the power distributor.

Figure 1:
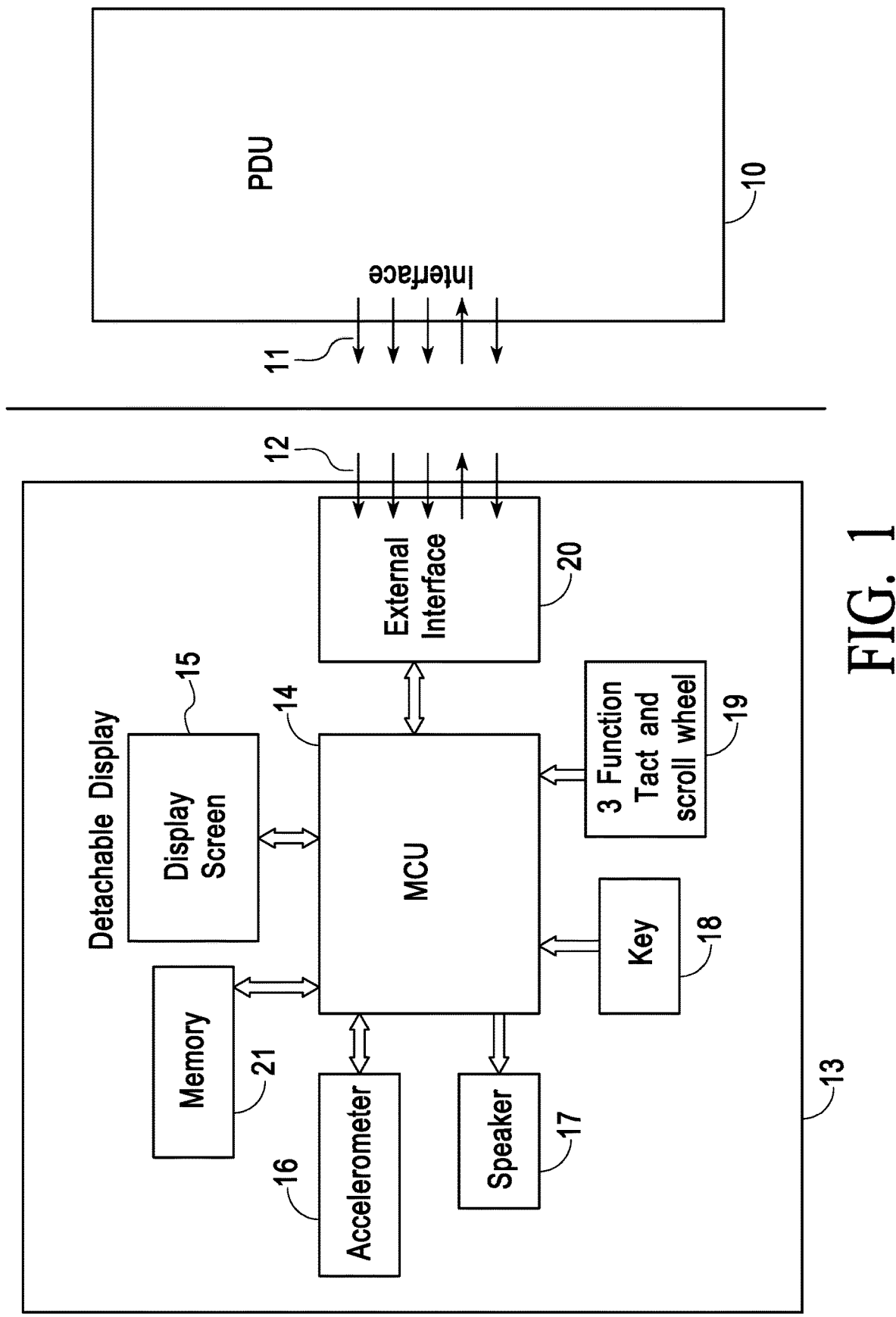
FIG. 1 shows a block diagram of a detachable display for a power distributor in accordance with an implementation.

FIG. 1 shows a simplified block diagram for a detachable display 13. Detachable display 13 includes, for example, a microcontroller unit 14, a display screen 15 and an external interface 20. For example, display screen 15 is a liquid crystal display (LCD). Alternatively, display screen 15 is implemented using light emitting diodes (LEDs) or any other type of technology available to display information.

External interface 20 communicates with an interface of a power distributor unit (PDU) 10. Signals 11 and signals 12 represent communication between power distributor unit 10 and detachable display 13. Power for detachable display 13 can also be supplied through one of signals 11 through 12. Alternatively, detachable display 13 can use an internal battery as a power source. Communication between power distributor unit 10 and detachable display 13 using signals 11 and signals 12 can be accomplished using wires. Alternatively, external interface 20 has wireless communication capability and communicates wirelessly with the interface of power distributor unit 10.

Depending upon desired application, detachable display 13 can incorporate and use additional functionality. For example, in FIG. 1, detachable display 13 is shown to optionally include an accelerometer 16, a speaker 17, a key 18 and a three-function tact and scroll wheel 19. Additional desired functionality can also be added to detachable display 13. A memory 21 is used to store information including configuration information.

Figure 2:
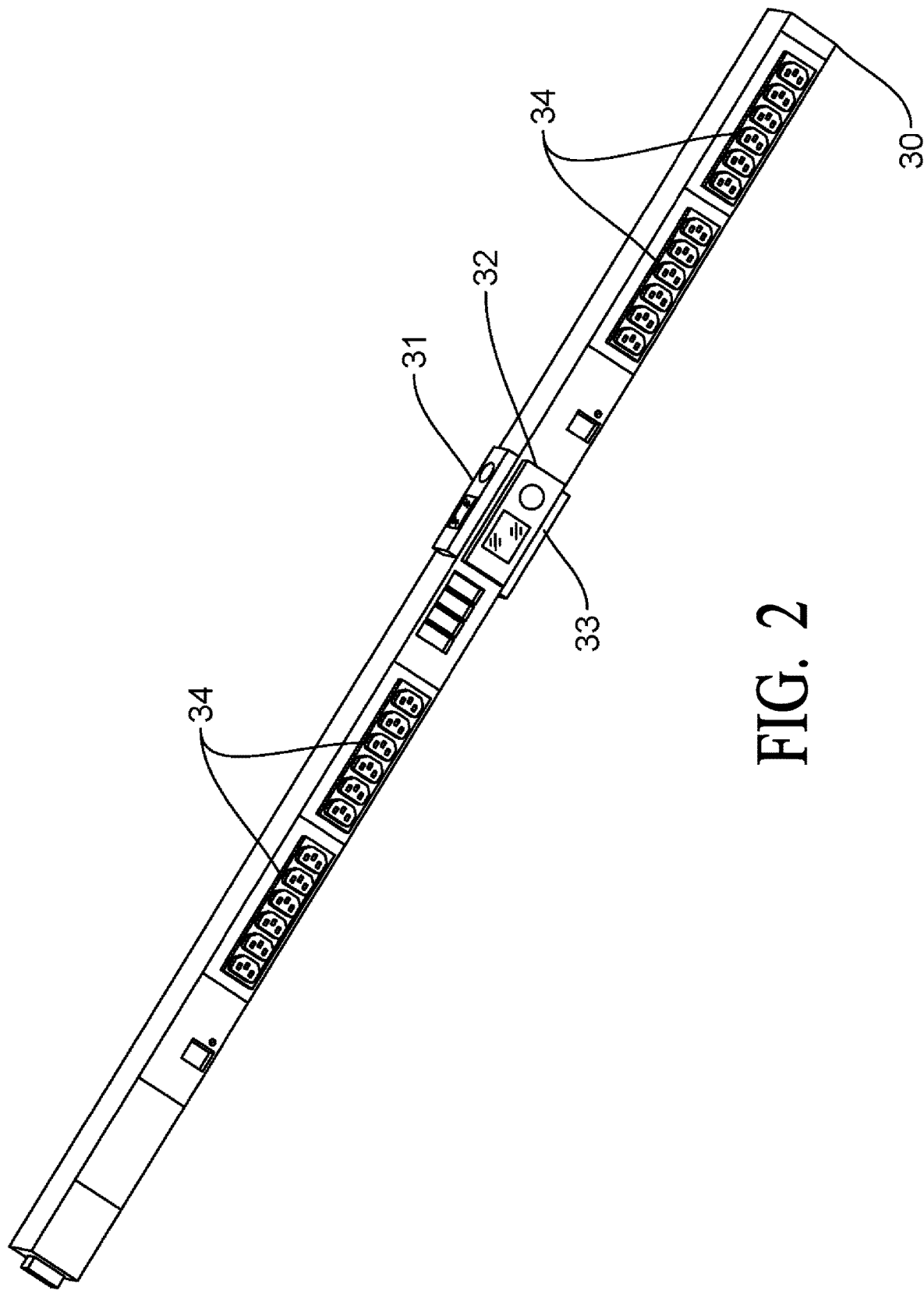
FIG. 2 shows three detachable displays mounted on a power distributor in accordance with an implementation.

FIG. 2 shows a power distributor 30 that includes power outlets 34. Power outlets 34 serve as electrical sockets. A detachable display 31, a detachable display 32 and a detachable display 33 are all shown attached to power distributor 30. While it would be unusual for all three of detachable display 31, detachable display 32 and detachable display 33 to be attached at the same time to power distributor 30, the locations of detachable display 31, detachable display 32 and detachable display 33 on power distributor 30 illustrate the locations of display ports on power distributor 30 that are available to receive a detachable display. Typically, at most, only one of the three available display ports of power distributor 30 would be connected to a detachable display at any one time. As shown in FIG. 2, each of detachable display 31, detachable display 32 and detachable display 33 faces in a different direction the other detachable displays.

Figure 3:
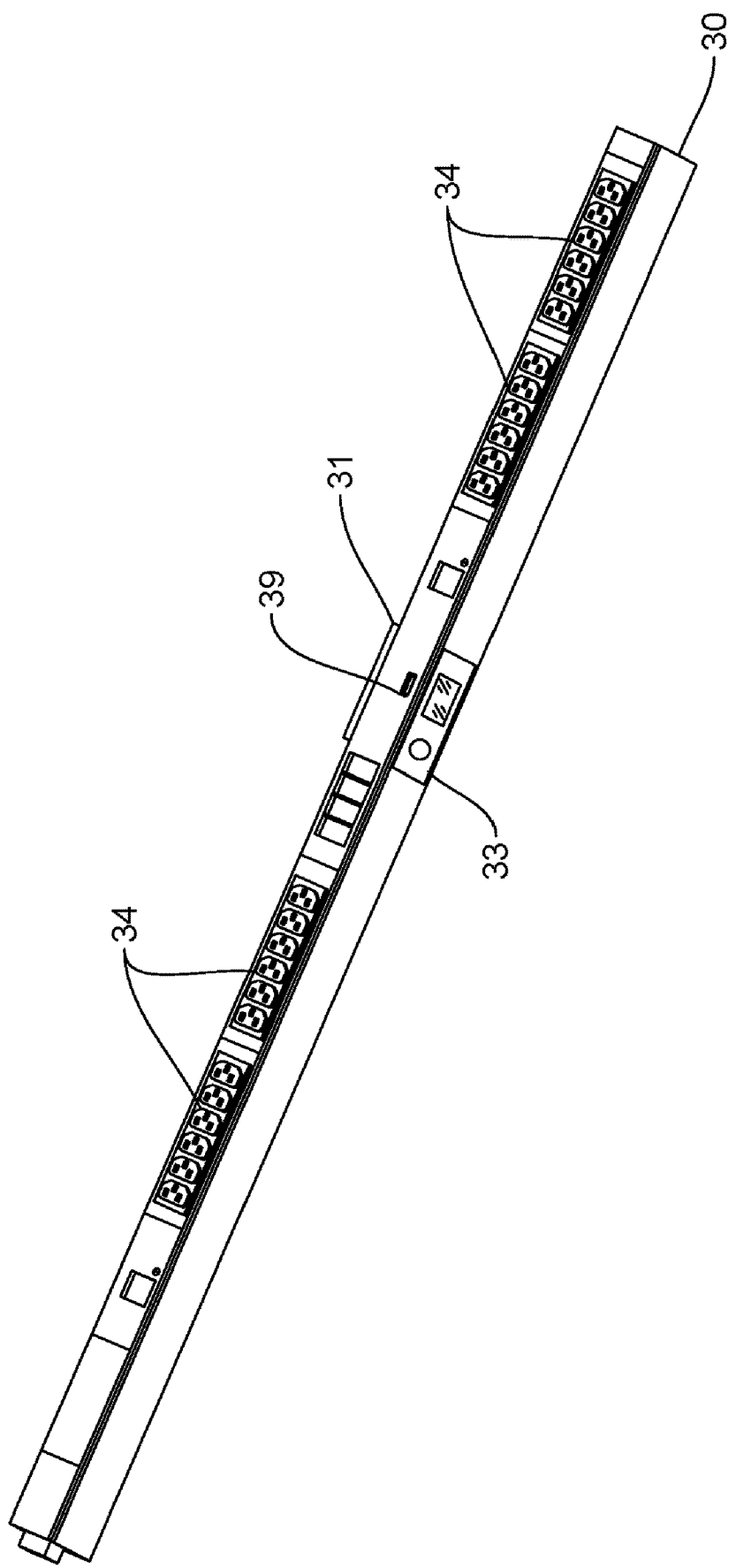
FIG. 3 shows one of the detachable displays shown in FIG. 2 removed from the power distributor in accordance with an implementation.

FIG. 3 shows detachable display 32 having been removed from power distributor 30. A connector 39 is shown revealed at the location on power distributor 30 where detachable display 32 was attached. For example, connector 39 includes contacts for power and/or signal wires of a detachable display. A region around connector 39 is composed of ferromagnetic material used to magnetically attach a detachable display to power distributor 30. Alternatively, a plug can be used to physically hold a detachable display to power distributor 30. Additionally, instead of using hard wire to communicate with detachable displays, power distributor 30 can be equipped with wireless communication capability.

Figure 4:
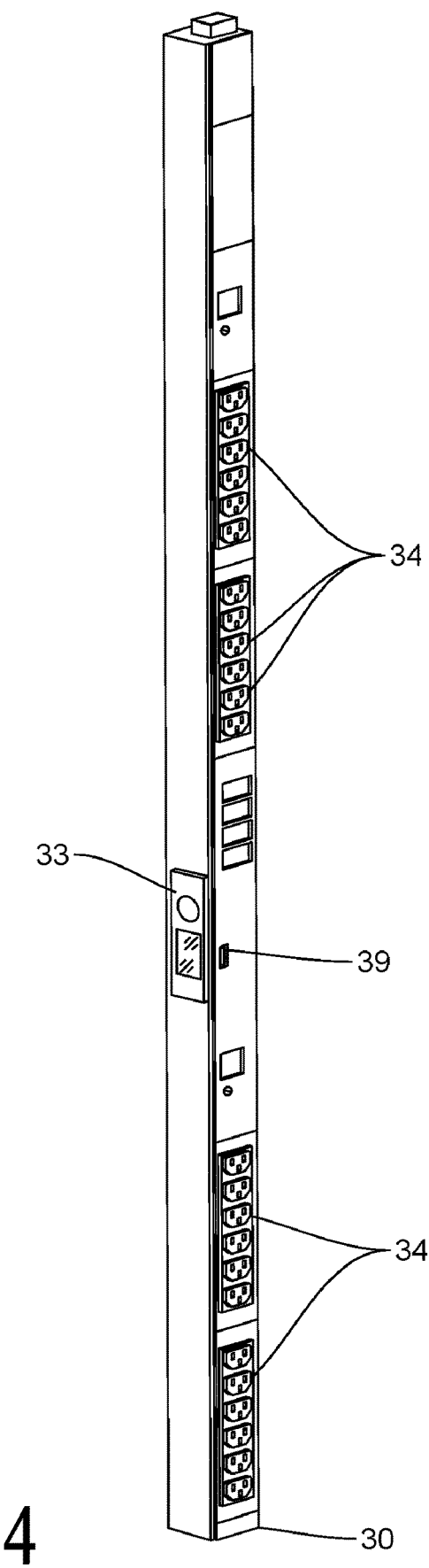
FIG. 4 shows a single detachable display mounted on a power distributor in accordance with an implementation.

FIG. 4 shows only detachable display 33 still connected to power distributor 30. Detachable display 33 can be attached to any of the three available display port locations of power distributor 30. While power distributor 30 is shown with three display ports, a power distributor can be designed with more or fewer display ports, depending upon design preferences.

Figure 5:
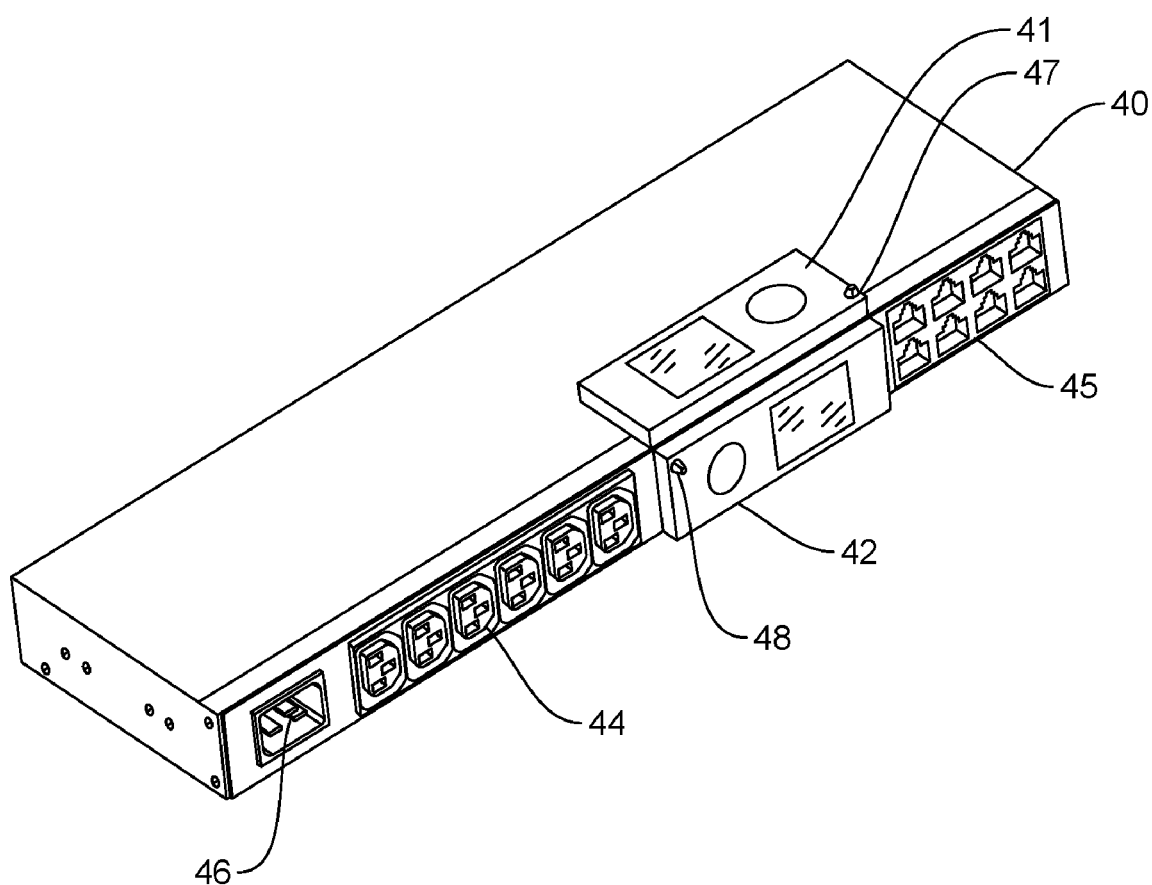
FIG. 5 shows two detachable displays mounted on a power distributor in accordance with an implementation.

FIG. 5 shows a power distributor 40 that includes power outlets 44, a power-in port 46 and networking ports 45. Power outlets 44 serve as electrical sockets. For example, networking ports 45 are Ethernet ports. A detachable display 41 and a detachable display 42 are shown attached to power distributor 40. While it would be unusual for both detachable display 41 and detachable display 42 to be attached at the same time to power distributor 40, the locations of detachable display 41 and detachable display 42 on power distributor 40 indicate the locations of display ports on power distributor 40 that are available to receive a detachable display. Typically, at most, only one of the three available display ports of power distributor 40 would be connected a detachable display at any one time.

A screw 47 is used to physically secure detachable display 41 to power distributor 40. A screw 48 is used to physically secure detachable display 42 to power distributor 40. Also, in FIG. 5, detachable display 41 and detachable display 42 are in different orientations, with the LCD for detachable display 41 oriented towards a left side of power distributor 40 and the LCD for detachable display 42 oriented towards a right side of power distributor 40. This illustrates the flexibility in mounting orientation of detachable display on display ports of power distributor 40.

Figure 6:
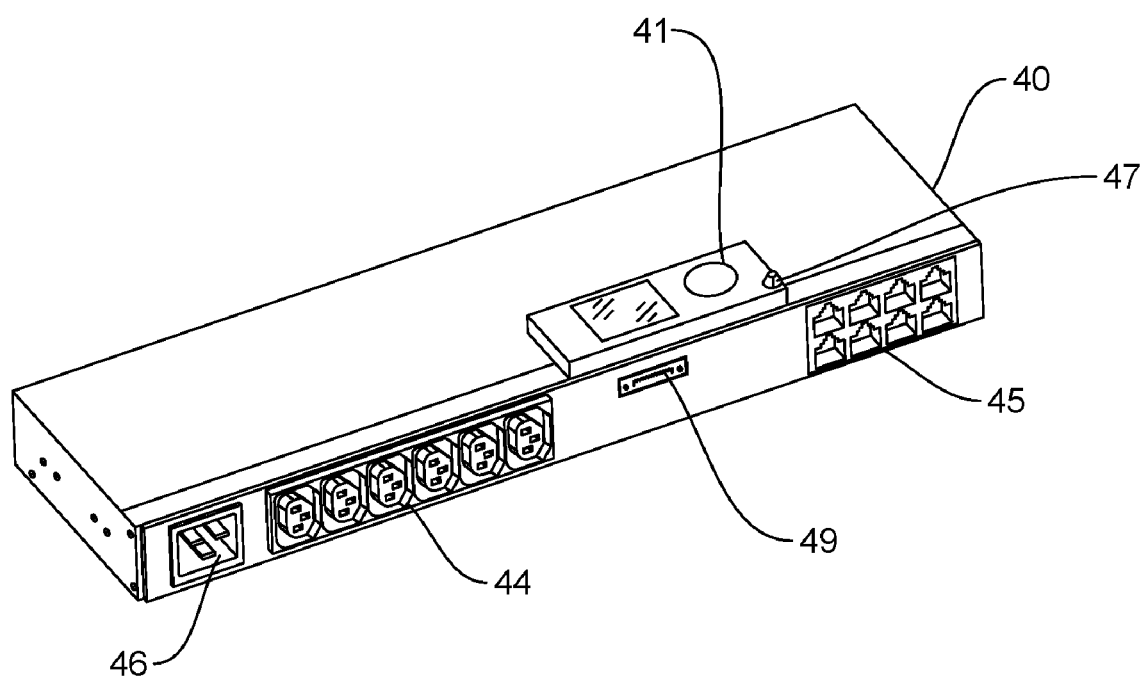
FIG. 6 shows a single detachable display mounted on a power distributor in accordance with an implementation.

FIG. 6 shows detachable display 42 having been removed from power distributor 40. A connector 49 is shown revealed at the location on power distributor 40 where detachable display 42 was attached. For example, connector 49 includes contacts for power and/or signal wires of a detachable display. Instead of using hard wire to communicate with detachable displays, power distributor 40 can be equipped with wireless communication capability.

Figure 7:
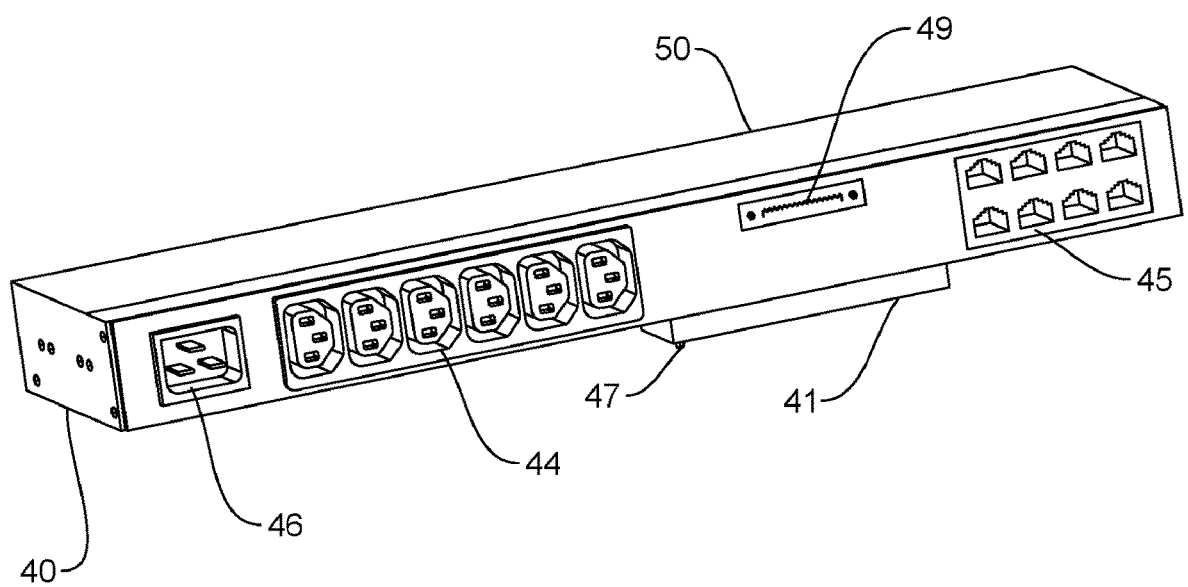
FIG. 7 shows a single detachable display mounted on a power distributor in accordance with an implementation.

FIG. 7 shows detachable display 41 moved to a different location on power distributor 40. To move detachable display 41, screw 47 was loosened. After detachable display 41 was placed in a new location on power distributor 40, screw 47 was tightened to hold detachable display 41 securely to the new location on power distributor 40. In the case where detachable display 42 was magnetically attached and used wireless communication, no connector need appear on power distributor 40. Instead, a magnet at or near location 50 or within detachable display 42 is used to secure detachable display 42 to power distributor 40 and wireless communication is used.

Figure 8:
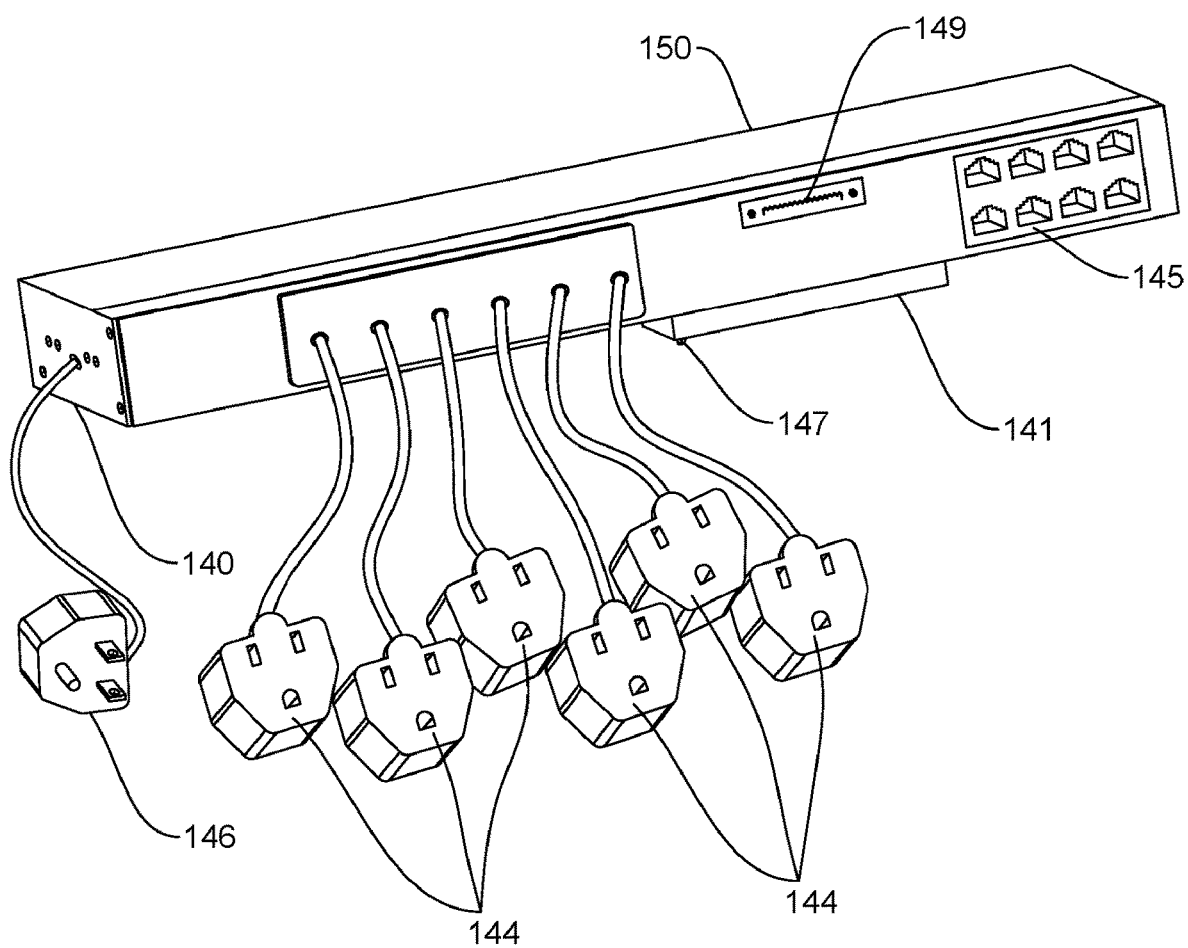
FIG. 8 shows a single detachable display mounted on a power distributor in accordance with an implementation.

FIG. 8 shows a power distributor 140 that includes power outlets 144 with wire extensions, a power-in plug 146 with a wire extension and networking ports 145. Power outlets 144 with the wire extension serve as electrical sockets for power distributor 140. For example, networking ports 145 are Ethernet ports. A detachable display 141 is shown attached to power distributor 140. A connector 149 is shown revealed at the location on power distributor 40 where a detachable display could be relocated. Alternatively, or in addition, in the case where the detachable display is magnetically attached and uses wireless communication, no connector need appear. Instead, a magnet at or near location 150 or within the detachable display is used to secure the detachable display to power distributor 140 and wireless communication is used.

Microcontroller unit 14 within detachable display 13 can also perform configuration synchronization. This allows detachable display 13 to be used for configuration backup, batch setting and recovery of power distributor unit 10, which is convenient for user management. Memory 21 within detachable display 13 can be used to store configuration information for one or more power distribution units.

For example, to perform a configuration backup, the configured PDU parameters for power distributor unit 10 are saved to detachable display 13. These parameters can include, for example, PDU Name information, sensor threshold and hysteresis, outlet control parameters, system settings, network settings (including basic network information), user data, and machine serial number. The saved configurations can be numbered to allow identification of particular configurations.

Figure 9:
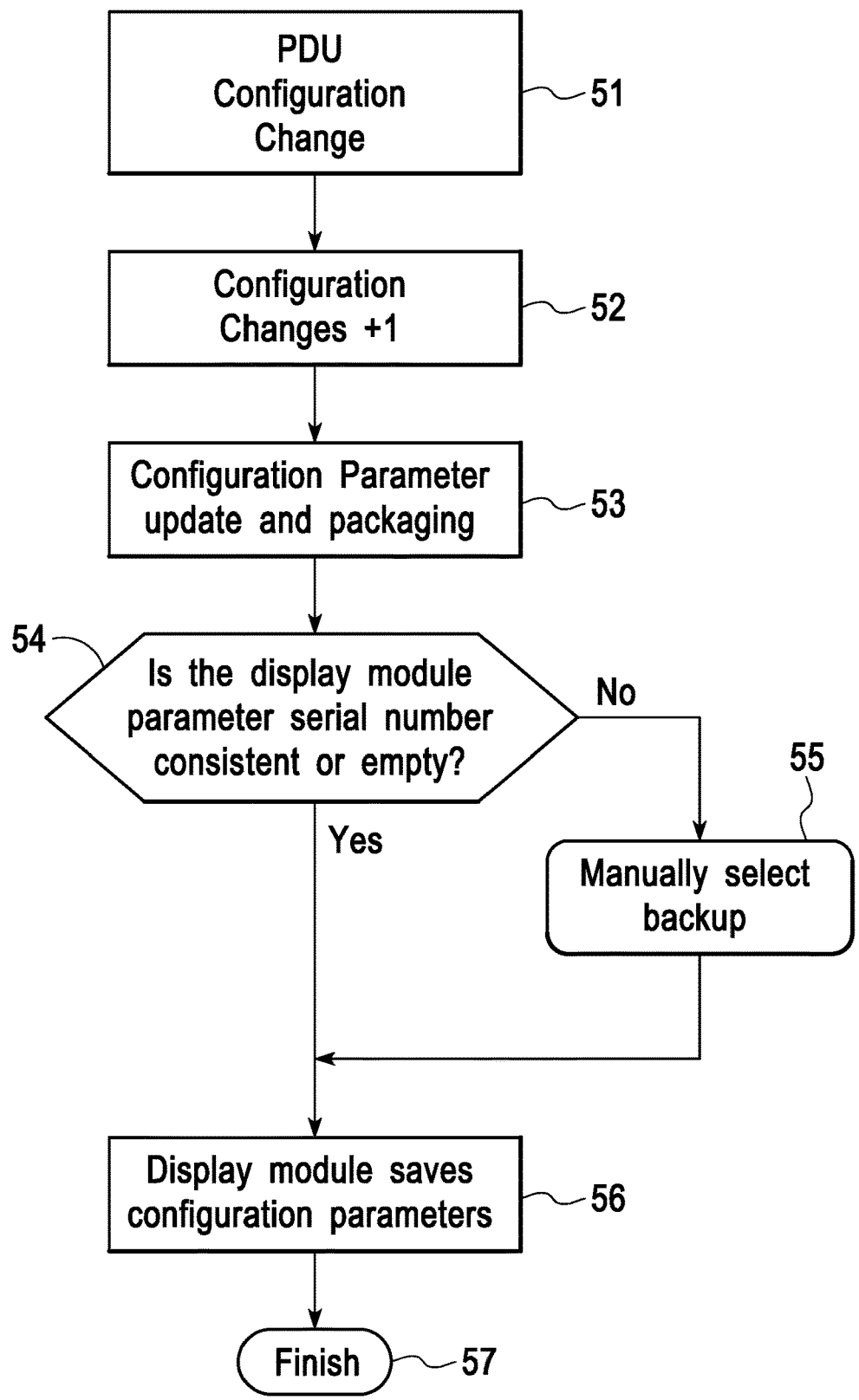
FIG. 9 shows an example flowchart for performing a configuration backup in accordance with an implementation.

FIG. 9 shows an example flowchart for performing a configuration backup. In a block 51, a user makes configuration changes to power distributor unit 10. In a block 52, the number of configuration changes is incremented, allowing accumulation of a system global variable that indicates configuration change times. In a block 53, detachable display 13 performs an update and package of the configuration parameters for power distributor unit 10.

In a block 54, detachable display 13 determines whether either the value of the serial number for power distributor unit 10 matches a PDU serial number stored within detachable display 13 for a previous backup or whether there is no PDU serial number stored within detachable display 13 for a previous backup. If either of these cases is affirmative, in a block 56, detachable display 13 stores the configuration parameters from power distributor unit 10 in memory 21.

If in block 54, detachable display 13 determines that the value of the serial number power distributor unit 10 does not match a PDU serial number stored within detachable display 13 for a previous backup, in a block 55, a manual selection for the back-up within memory 21 of detachable display 13 is selected by the user before, in block 56, detachable display 13 stores the configuration parameters from power distributor unit 10 in memory 21. In a block 57, the configuration backup is completed.

A batch setting can be used to copy the PDU configuration information saved in detachable display 13 to multiple power distributor units of the same model. This allows multiple PDUs to be easily configured to have the same configuration parameters. For example, batch configurations do not include the basic network information and the serial number of the individual power distributor units.

Figure 10:
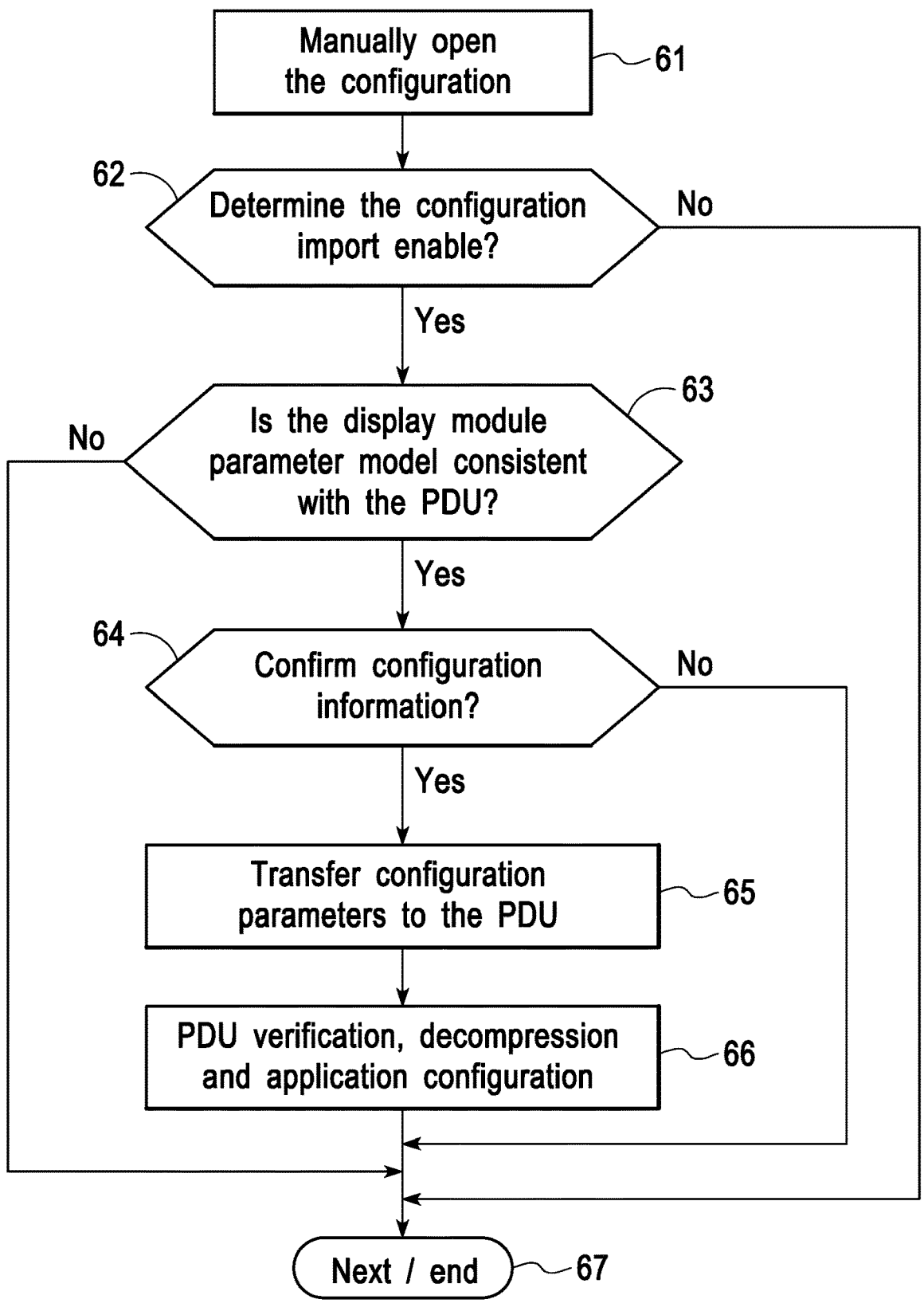
FIG. 10 shows an example flowchart for performing a batch configuration in accordance with an implementation.

FIG. 10 shows an example flowchart for performing a batch configuration. In a block 61, a user manually opens the configuration within a first power distributor unit. In a block 62, a determination is made as to whether a configuration import has been enabled for the power distribution unit. If not, in a block 67, the batch configuration aborts for this power distribution unit and another power distribution unit is selected. When there are no more power distribution units to configure, the batch configuration process ends.

When the configuration import has been enabled, in a block 63, a check is made as to whether the parameter model is consistent with the configuration parameters of the power distribution unit. If not, in block 67, the batch configuration aborts for this power distribution unit and another power distribution unit is selected. When there are no more power distribution units to configure, the batch configuration process ends.

When the parameter model is consistent with the configuration parameters of the power distribution unit, in a block 64, a determination is made as to whether confirmation information is confirmed as meeting any conditions for changing the configuration of the power distribution unit. If the configuration information is not confirmed, in block 67, the batch configuration aborts for this power distribution unit and another power distribution unit is selected. When there are no more power distribution units to configure, the batch configuration process ends.

If the configuration information is confirmed, in a block 65, the detachable display transfers configuration parameters to the power distribution unit. In a block 66, the power distribution unit performs verification, decompression and application configuration. Then, in block 67, another power distribution unit is selected. When there are no more power distribution units to configure, the batch configuration process ends. For example, a new power distribution unit is selected by attaching detachable display 13 to the new power distribution unit.

Configuration recovery can be accomplished by transferring all configuration information saved in detachable display 13 to a brand new power distribution unit, including basic network information and serial number for the power distribution unit.

Figure 11:
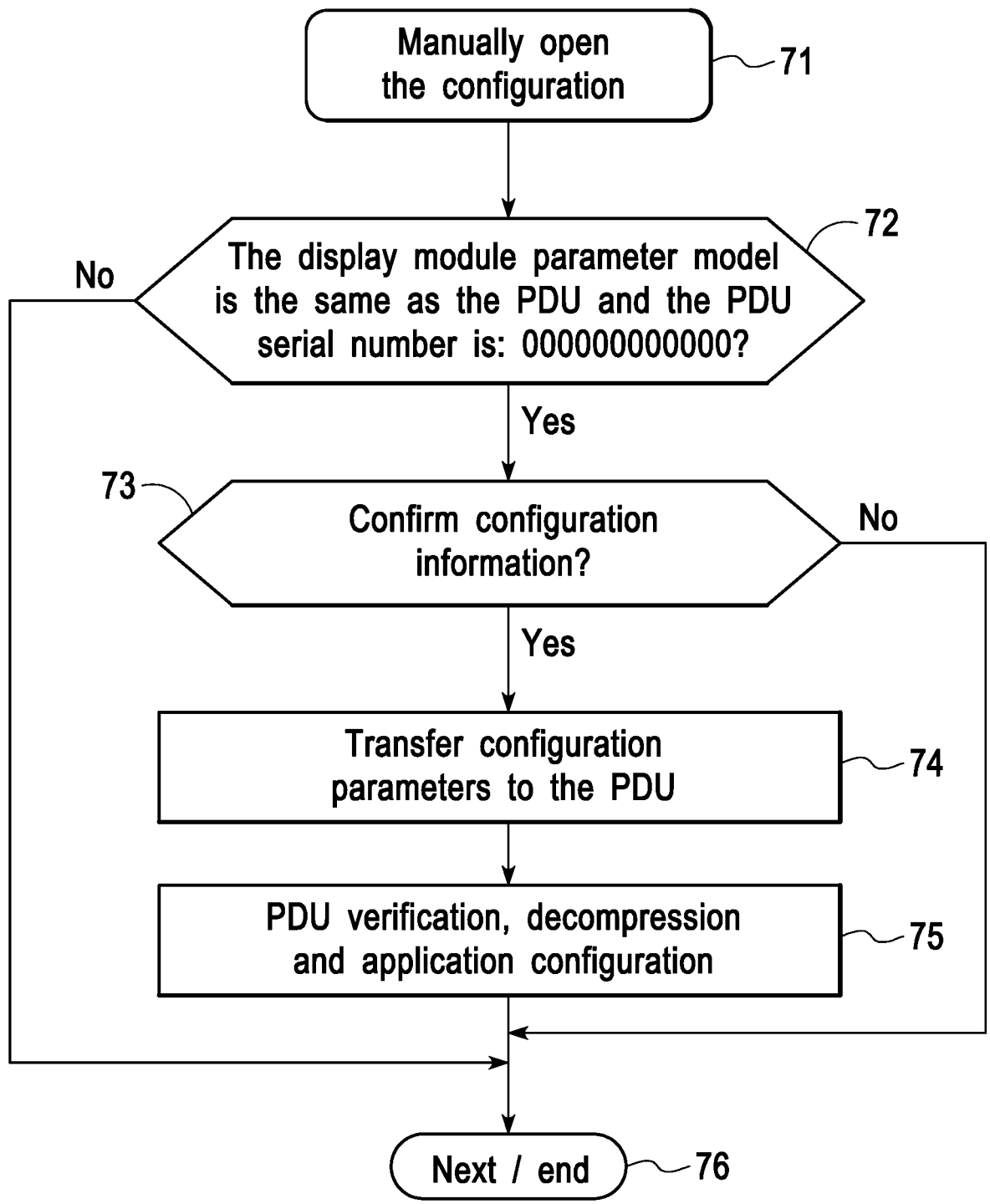
FIG. 11 shows an example flowchart for performing a configuration recovery in accordance with an implementation.

FIG. 11 shows an example flowchart for performing a configuration recovery.

In a block 71, a user manually opens the configuration within a first power distributor unit. In a block 72, a check is made as to whether both the parameter model for the recovery information is consistent with the configuration parameters of the power distribution unit and the serial number of the power distribution unit is a default value such as 00000000000. If not, in block 76, the configuration recovery for this power distribution unit and another power distribution unit is selected. When there are no more power distribution units to configure, the configuration recovery process ends.

When both the parameter model for the recovery information is consistent with the configuration parameters of the power distribution unit and the serial number of the power distribution unit is a default value, in a block 73, a determination is made as to whether confirmation information is confirmed as meeting any conditions for changing the configuration of the power distribution unit. If the configuration information is not confirmed, in block 76, the configuration recovery aborts for this power distribution unit and another power distribution unit is selected. When there are no more power distribution units to configure, the configuration recovery process ends.

If the configuration information is confirmed, in a block 74, the detachable display transfers configuration parameters to the power distribution unit. In a block 75, the power distribution unit performs verification, decompression and application configuration. Then, in block 76, another power distribution unit is selected. When there are no more power distribution units to configure, the configuration recovery process ends. For example, a new power distribution unit is selected by attaching detachable display 13 to the new power distribution unit.

The foregoing discussion discloses and describes merely exemplary methods and embodiments. As will be understood by those familiar with the art, the disclosed subject matter may be embodied in other specific forms without departing from the spirit or characteristics thereof. Accordingly, the present disclosure is intended to be illustrative, but not limiting, of the scope of the invention, which is set forth in the following claims.

What is claimed is:

1. A power distributor system comprising:
   a single detachable display for the power distributor system; and
   a plurality of power distribution units, each power distribution unit, including:
      a plurality of electrical sockets, and
      a display port available to provide connection to the single detachable display;
      configuration parameters stored within the power distribution unit;
   wherein the single detachable display includes:
      a memory that contains configuration information for each power distribution unit in the plurality of power distribution units, and
      an external interface through which the configuration information can be transmitted through the display port to each power distribution unit and stored by each power distribution unit as the configuration parameters;
   wherein the single detachable display is physically attached to casing of each power distribution unit in the plurality of power distribution units to perform batch configuration of the plurality of power distribution units and to backup configuration within each of the power distribution unit in the plurality of power distribution units.

2. A power distributor system as in claim 1 wherein the external interface configuration allows a back-up of the configuration parameters to be transferred to the single detachable display for storage within the memory.

3. A power distributor system as in claim 1 wherein the external interface configuration also allows the configuration information to be transmitted to other power distribution units and stored by the other power distribution units as configuration parameters for the other power distribution units, wherein the other power distribution are power distribution units that are in addition of the power distribution unit.

4. A power distributor system as in claim 1 wherein the display port is one of a plurality of display ports included in the power distribution unit.

5. A power distributor system as in claim 1 wherein the single detachable display is powered through the external interface.

6. A power distributor system as in claim 1 wherein the single detachable display includes a battery.

7. A power distributor system as in claim 1 wherein the single detachable display additionally includes:
   an accelerometer.

8. A power distributor system as in claim 1 wherein the single detachable display additionally includes:
   a speaker.

9. A power distributor system as in claim 1 wherein the single detachable display additionally includes:
   a tact and scroll wheel.

10. A power distributor system as in claim 1, additionally comprising:
    a plurality of networking ports.

11. A power distributor system as in claim 1, wherein the display port is one of a plurality of display ports included in the power distribution unit and wherein the single detachable display is magnetically attached at a first display port of the plurality of display ports.

12. A power distributor system as in claim 1:
wherein the single detachable display is magnetically attached at the power distribution unit; and
wherein the single detachable display includes a wireless interface through which the single detachable display communicates with an internal wireless interface within the power distribution unit when the single detachable display is magnetically attached to the power distribution unit.

13. A power distributor system as in claim 1, wherein the display port is one of a plurality of display ports included in the power distribution unit and wherein the single detachable display is attached at the first display port of the plurality of display ports using a physical attachment device.

14. A power distributor system as in claim 1, wherein the single detachable display includes a wired interface through which the single detachable display communicates with an internal wired interface within the power distribution unit.

15. A method for configuring a power distributor system having a plurality of power distributor units, the method comprising:
storing configuration information within a memory in a detachable display of the power distributor;
attaching the detachable display to a display port of each power distribution unit in the plurality of power distributor units, each power distribution unit including a plurality of electrical sockets;
transferring the configuration information from the detachable display through the display port to each power distribution unit in the plurality of power distributor units; and,
storing the configuration information as configuration parameters within each power distribution unit in the plurality of power distributor units.

16. A method as in claim 15, wherein the configuration parameters include at least one of the following:
power distribution unit name information;
sensor threshold and hysteresis;
outlet control parameters;
system settings;
network settings;
user data;
serial number.

17. A method as in claim 15 wherein the method additional comprises:
attaching the detachable display to a display port of an additional power distribution unit;
transferring the configuration information from the detachable display through the display port of the additional power distribution unit; and,
storing the configuration information within the additional power distribution unit as configuration parameters.

18. A method for backing up configuration parameters of a power distributor system that has a plurality of power distribution units, the method comprising:
attaching a detachable display to a display port of each power distribution unit in the plurality of power distribution units, each power distribution unit including a plurality of electrical sockets;
transferring configuration parameters within each power distribution unit through the display port to the detachable display;
storing the configuration parameters within a memory of the detachable display as back-up configuration information for the power distribution unit so that the detachable display stores configuring parameters for all power distribution units within the plurality of distribution units.

19. A method as in claim 18, wherein the configuration parameters include at least one of the following:
power distribution unit name information;
sensor threshold and hysteresis;
outlet control parameters;
system settings;
network settings;
user data;
serial number.

* * * * *